United States Patent
George

(10) Patent No.: US 8,710,899 B2
(45) Date of Patent: Apr. 29, 2014

(54) STEPPED DELAY CONTROL OF INTEGRATED SWITCHES

(75) Inventor: Richard V. George, Apalachin, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 921 days.

(21) Appl. No.: 12/212,047

(22) Filed: Sep. 17, 2008

(65) Prior Publication Data

US 2010/0066427 A1    Mar. 18, 2010

(51) Int. Cl.
*H03K 17/687*    (2006.01)
*H03K 17/06*    (2006.01)

(52) U.S. Cl.
CPC .................................. *H03K 17/063* (2013.01)
USPC ...................................................... 327/427

(58) Field of Classification Search
USPC ......... 327/365, 379, 419, 387, 388, 403, 518, 327/519, 520, 427–437
See application file for complete search history.

(56) References Cited

U.S. PATENT DOCUMENTS

| | | | |
|---|---|---|---|
| 4,975,604 A | 12/1990 | Barta | |
| 4,978,932 A | 12/1990 | Gupta et al. | |
| 5,001,524 A | 3/1991 | Golio et al. | |
| 5,099,247 A * | 3/1992 | Basile et al. | 342/380 |
| 5,151,669 A | 9/1992 | Roques et al. | |
| 5,414,389 A | 5/1995 | Watanabe et al. | |
| 5,465,408 A | 11/1995 | Sugayama et al. | |
| 5,742,204 A | 4/1998 | Bell | |
| 6,026,284 A | 2/2000 | Seo | |
| 6,144,265 A | 11/2000 | Dosdall et al. | |
| 6,272,323 B1 | 8/2001 | Kurihara | |
| 6,337,974 B1 | 1/2002 | Inamori et al. | |
| 6,542,018 B1 | 4/2003 | Yin | |
| 6,545,563 B1 * | 4/2003 | Smith | 333/103 |
| 6,819,603 B2 * | 11/2004 | Jones et al. | 365/194 |
| 6,891,434 B2 | 5/2005 | Sobel | |
| 6,937,530 B2 * | 8/2005 | Bell | 365/189.02 |
| 7,053,680 B2 * | 5/2006 | Masleid et al. | 327/112 |
| 7,202,734 B1 | 4/2007 | Raab | |
| 7,205,817 B1 | 4/2007 | Huang et al. | |
| 7,221,967 B2 | 5/2007 | Van Buren et al. | |
| 7,323,922 B1 | 1/2008 | Jones | |
| 2007/0275686 A1 | 11/2007 | Stevenson et al. | |
| 2008/0191791 A1 * | 8/2008 | Nomura et al. | 327/540 |

FOREIGN PATENT DOCUMENTS

| | | |
|---|---|---|
| DE | 2541477 A | 3/1977 |
| EP | 0 446 073 A1 | 9/1991 |
| JP | 57065014 A | 4/1982 |
| JP | 60223315 A | 11/1985 |
| JP | 02021701 A | 1/1990 |

* cited by examiner

*Primary Examiner* — Sibin Chen

(74) *Attorney, Agent, or Firm* — Wolf, Greenfield & Sacks, P.C.

(57) ABSTRACT

An integrated switching device, such as an RF attenuator, can be controlled to be in various states according to control bits of a control signal. The integrated switching device can be gradually transitioned from one state to another by staggering the timing of changing the control bits. Latch-up problems in the integrated switching device can thereby be reduced or prevented.

16 Claims, 7 Drawing Sheets

| Transfer Interval | Control State | Attenuation Level |
|---|---|---|
| 0 | 00110 | 6dB |
| 1 | 10110 | 22dB |
| 2 | 11110 | 30dB |
| 3 | 11010 | 26dB |
| 4 | 11000 | 24dB |

STEPPED DELAY CONTROL OF INTEGRATED SWITCHES

STATEMENT REGARDING FEDERALLY SPONSORED RESEARCH OR DEVELOPMENT

This invention was made with U.S. government support under Contract No. FA8682-04-C-0004 awarded by the United States Air Force (USAF). The government has certain rights in the invention.

DISCUSSION OF RELATED ART

Various types of integrated switches are used for turning electronic devices on and off. One commonly-used switch technology for integrated circuits is known Complimentary Metal Oxide Semiconductor (CMOS). A CMOS switch has two complimentary MOS transistors (known as N-channel and P-channel transistors) coupled in series between power and ground terminals with their control gates connected to one another. CMOS switches are a basic building block for a wide variety of electronic devices. One example is a Radio Frequency (RF) attenuator, an electronic device used to reduce the strength of an incoming signal for measurement purposes. RF attenuators are discussed in further detail below.

One problem with integrated CMOS switches is that they can "latch-up," which means that a CMOS switch becomes stuck in the "on" state. Latch-up can cause improper functioning of the CMOS integrated circuit, such as an intermittent control failure that can stress internal transistor junctions, a hard control failure that can require power sequencing to remove the latch-up condition, or a catastrophic control failure, such as breakdown of the transistor's semiconductor junctions. Latch-up can be caused by triggering a low-impedance current path through the complimentary gate devices of a CMOS switch between the power rails, which can extend through semiconductor regions of alternating P and N doping concentration (such as a PNPN path). Due to these problems and others, it would be desirable to reduce or prevent latch-up problems.

SUMMARY

The Applicant has appreciated that latch-up problems in integrated switches, such as RF attenuators using integrated CMOS switches, can be caused by setting all of the control bits for the RF attenuator into a new control state at the same time. In some embodiments, latch-up problems in RF attenuators and other integrated switching devices can be reduced or avoided by gradually changing the control bits into the next desired state. Several exemplary techniques are discussed below.

Some embodiments relate to methods of controlling an integrated circuit to transition from a first control state to a second control state. The integrated circuit is controlled in response to receiving a control signal having a plurality of control bits. Each of the plurality of control bits controls a switch state for a corresponding switch of the integrated circuit. One control state is represented by a first plurality of control bits and another control state is represented by a second plurality of control bits. The integrated circuit is controlled to be in the first state by driving the plurality of switches of the integrated with the first plurality of control bits. The integrated circuit is controlled to be in the second state by driving the plurality of switches with the second plurality of control bits at different times, such that at least a first one of the second plurality of control bits is controlled to arrive at a different time than that of at least a second one of the second plurality of control bits. These methods may be encoded as computer-implemented instructions on any suitable computer storage media, and performed by execution on a processor, in some embodiments.

Some embodiments relate to a circuit for controlling an integrated circuit to transition from a first control state to a second control state. The integrated circuit is controlled to be in various control states in response to receiving a control signal having a plurality of control bits. Each of the plurality of control bits controls a switch state for a corresponding switch of the integrated circuit. One control state is represented by a first plurality of control bits and another control state is represented by a second plurality of control bits. The circuit may include a control unit to provide the control signal to the plurality of switches, the control signal comprising the second plurality of control bits. The circuit may also include at least one control terminal coupled to the control unit to provide the second plurality of control bits to the plurality of switches at different times. At least a first one of the second plurality of control bits may arrive at a different time than that of at least a second one of the second plurality of control bits.

DETAILED DESCRIPTION

Integrated switching devices, such as integrated CMOS switches, are known to be susceptible to latch-up problems that can cause device wear or failure. One example of such an integrated switching device is an RF attenuator, which can be used to reduce the signal strength of a received RF signal. RF attenuators may be used in a variety of applications, such as radar or cellular telephones, for example, to reduce the amplitude of a received signal for measurement purposes. Some RF attenuators can be digitally controlled to change the degree of attenuation that they perform. Such RF attenuators have been found to have yield and reliability problems due to latch-up of their internal switches. One attempt at reducing the likelihood of latch-up has been to filter the digital control inputs of the CMOS switching device, with each control input being filtered with a similar filter. Although such filtering may reduce the likelihood of latch-up, latch-up problems continue to occur and reliability problems remain. These reliability problems can be of particular concern for military applications, in which latch-up may cause mission failure.

The Applicant has appreciated that such latch-up problems can be caused by transient currents that occur upon changing the digital control state of the RF attenuator. In prior systems, the digital control state of the RF attenuator was changed by providing a new control word to the RF attenuator with all of the control bits being set into the new state at the same time. In some circumstances, setting all of the control bits into the new state caused multiple control bits to be changed simultaneously. Applicant has appreciated that changing a number of control bits at the same time can cause large transient currents within the integrated switching device, which can lead to latch-up problems.

In some embodiments, integrated switch latch-up problems can be reduced or eliminated by adjusting the timing at which the control bits of the control signal are changed so that different control bits change at different times, providing a gradual transition to the new control state. Instead of setting all of the control bits into the new control state at the same time, the control bits may be changed over time in a step-wise manner to reduce the likelihood of causing transient currents in the integrated switching device that could lead to latch-up.

Figure 1:
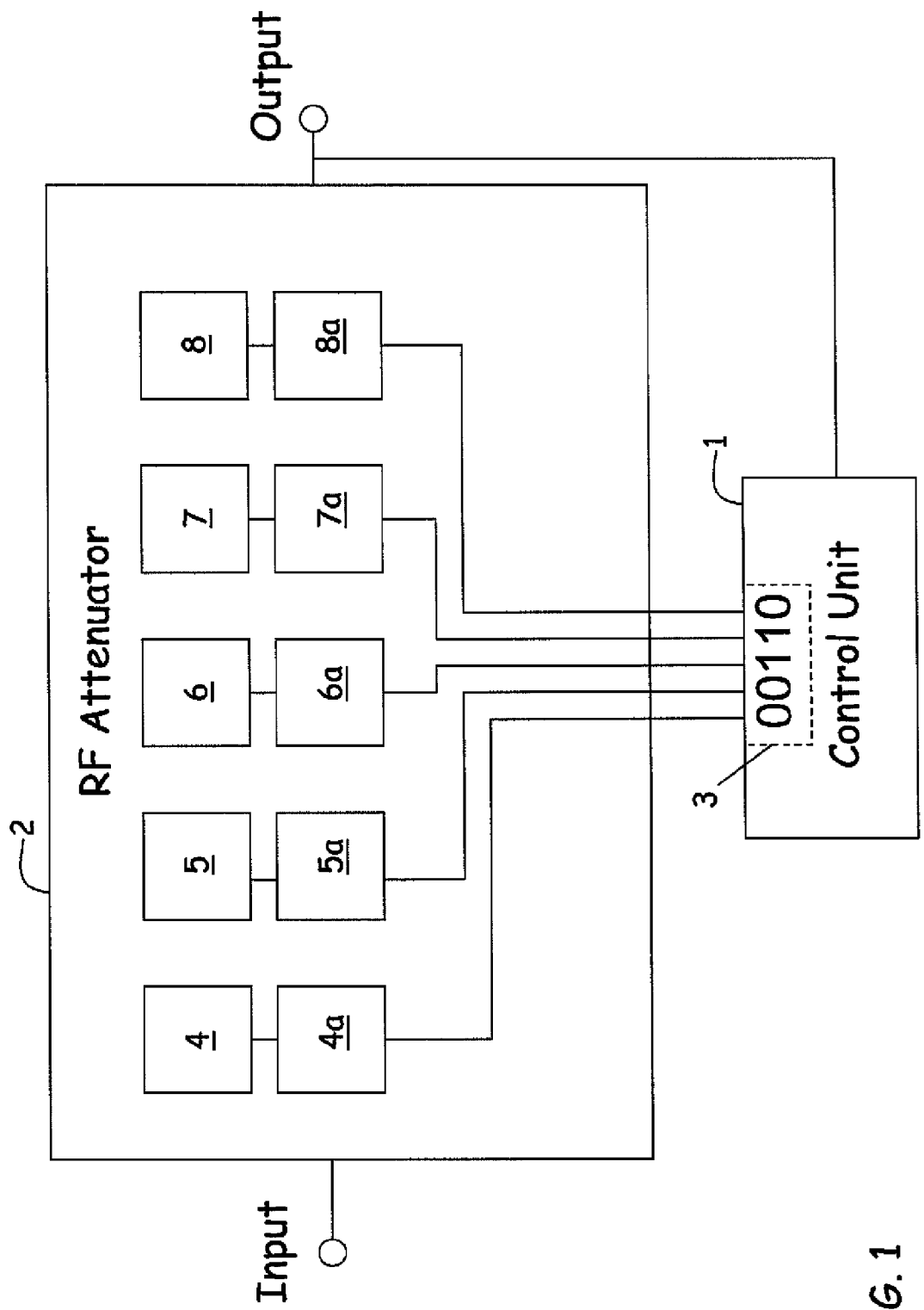
FIG. 1 is a block diagram of a system in which a control unit controls an RF attenuator, according to some embodiments.

FIG. 1 is a block diagram showing a control unit 1 that controls an RF attenuator 2, according to some embodiments. RF attenuator 2 receives an RF input signal, and attenuates the RF input signal to produce an RF output signal of smaller magnitude. RF attenuator 2 can attenuate the input signal according to various degrees of attenuation, depending on the control signal 3 received from control unit 1. As shown in FIG. 1, control signal 3 may be a digital control signal that provides a digital control word with a plurality of control bits to RF attenuator 2. In the example shown in FIG. 1, control signal 3 provides a control word having five control bits, which collectively represent the control state for the RF attenuator. The control word of control signal 3 may be binary number representing the degree of attenuation that RF attenuator 2 is to perform. As one example, the binary word 00110 shown in FIG. 1 has a decimal value of six, which may represent the number of decibels (dB) of attenuation (6 dB) that RF attenuator 2 will be controlled to perform on the RF input signal.

In some embodiments, control unit 1 may detect the level of the output signal of the RF attenuator 2 and adjust the control state of RF attenuator 2 so that the output signal has a suitable level for measurement or other purposes. If the output signal is too small in magnitude, control unit 1 may decrease the level of attenuation performed by RF attenuator 2 by changing the control state of RF attenuator 2 into a state that performs a lower level of attenuation. If the output signal is too high, control unit 1 may increase the level of attenuation performed by RF attenuator 2.

As illustrated in FIG. 1, control signal 3 provides a control word that has a plurality of control bits. In some embodiments, each control bit controls a corresponding attenuation component of RF attenuator 2. In the example shown in FIG. 1, the first bit of control signal 1 is provided to switch 4a that turns on/off attenuation component 4. The second bit of control signal 1 controls switch 5a that turns on/off attenuation component 5; the third bit controls switch 6a that turns on/off attenuation component 6; the fourth bit controls switch 7a that turns on/off attenuation component 7; and the fifth bit controls switch 8a that turns on/off attenuation component 8. Attenuation components 4-8 may have the same attenuation values, or they may have different attenuation values. In some embodiments, each attenuation component 4-8 may provide a degree of attenuation that corresponds to the binary weight of the corresponding bit in the control word. For example, attenuation component 8, corresponding to the least significant bit of the control word, may provide an attenuation of 1 dB; attenuation component 7 may provide an attenuation of 2 dB; attenuation component 6 may provide an attenuation of 4 dB; attenuation component 5 may provide an attenuation of 8 dB; and attenuation component 4, corresponding to the most significant bit, may provide an attenuation of 16 dB. Thus, by setting the control bits of control signal 3 into the appropriate states, the RF attenuator 2 may be set to perform any integer attenuation level (in dB) from 0 to 31. For example, in the control state 00110, attenuation components 6 and 7 may be turned on using their associated switches and the other attenuation components may be turned off. As another example, in the control state 11000, attenuation components 4 and 5 may be turned on using their associated switches and the other three attenuation components may be turned off. If the attenuation components 4-8 have attenuation values that correspond to weights of their respective bits in the control word, the first control state of 00110 may configure the attenuator for 6 dB of attenuation, and the second control state of 11000 may configure the attenuator for 24 dB of attenuation, for example.

In previous systems, to change control states of an integrated switching device, the control bits of the control signal were all set simultaneously so that the control word changed directly from the first control state to the second control state (e.g., during the next clock cycle). For example, to switch from 6 dB of attenuation to 24 dB of attenuation, the control bits would be changed from the first state of 00110 directly into the second state of 11000. In response to this change in the control signal, the first two switches 4a and 5a turn on attenuation components 4 and 5, and the third and fourth switches 6a and 7a turn off attenuation components 6 and 7, respectively. Thus, changing from the first control state of 00110 to the second control state of 11000 would cause four switches 4a-7a to switch at the same time. However, as discussed above, the Applicant has appreciated that switching a number of integrated switches at the same time can cause latch-up problems.

Instead of setting all of the control bits into a new state at the same time, the control bits of control signal 3 may be changed gradually, such that changes in the individual control bits are staggered in time. In some embodiments, control unit 1 may be configured to change only a single control bit at a time, even though multiple control bits need to be changed to reach the desired control state. In a first clock cycle, the first control bit may be changed, if necessary. In a second clock cycle, the second control bit may be changed, if necessary, etc., until the desired control state is reached.

Figure 2:
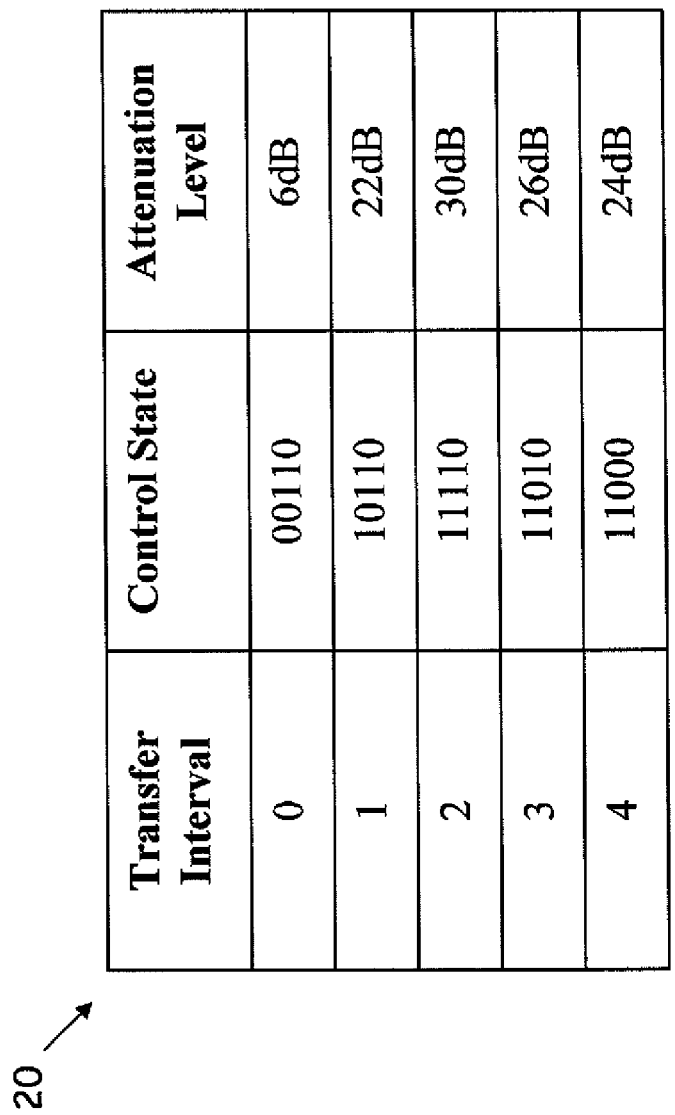
FIG. 2 shows a table illustrating a technique for gradually changing from one control state to another, according to some embodiments.

FIG. 2 shows table 20 which illustrates an embodiment in which a single control bit is changed at a time. As shown in table 20, in transfer interval 0, control unit 1 drives RF attenuator 2 with the control word 00110, corresponding an initial attenuation state of 6 dB. At some point, control unit 1 may decide to increase the attenuation from 6 dB to 24 dB. To transition from state 00110 (6 dB) to state 11000 (24 dB), control unit 1 may gradually transition the control bits of control signal 3 into the new state. For example, in the first transfer interval, only the first (left-most) control bit is changed, such that the control signal 10110 is sent to the RF attenuator 2. After a delay in which the first transfer interval is completed, the second transfer interval begins and control unit 1 changes the second bit of the control signal, and the control signal 11110 is sent to the RF attenuator 2. Then, after another delay in which the second transfer interval is completed, the third transfer interval begins and control unit 1 changes the third bit of the control signal, and the control signal 11010 is sent to the RF attenuator 2. In the fourth transfer interval, the fourth bit is changed from a 1 to a 0, and the control signal 11000 is sent to the RF attenuator 2.

In the embodiment shown in FIG. 2, the bits of the control signal are changed progressively from left to right. However, the invention is not limited in this respect, as the bits of the control signal can be changed in any suitable order, such as from right to left or in some other order. Other variations are also possible. For example, the invention is not limited to changing a single bit at a time, because in some circumstances, latch-up problems may be avoided by changing more than one control bit at a time, such as two control bits or three control bits. In some circumstances, the most suitable way of gradually changing the bits of the control signal may depend on the particular design of integrated switching device and/or control device.

The gradual staggering of the control bit transitions can be implemented in any of a variety of ways, such as using software or firmware, or analog delay elements. If control unit 1 is implemented in software or firmware, the software and/or firmware may be configured/programmed to make the transition between states in any suitable way in accordance with the techniques described herein. As one example, one of the bits in the control signal may be set into the new control state during each clock cycle of the control unit 1, such that the transfer intervals of FIG. 2 correspond to clock cycles of the control unit. Other ways of transitioning between control states are also possible.

Figure 3:
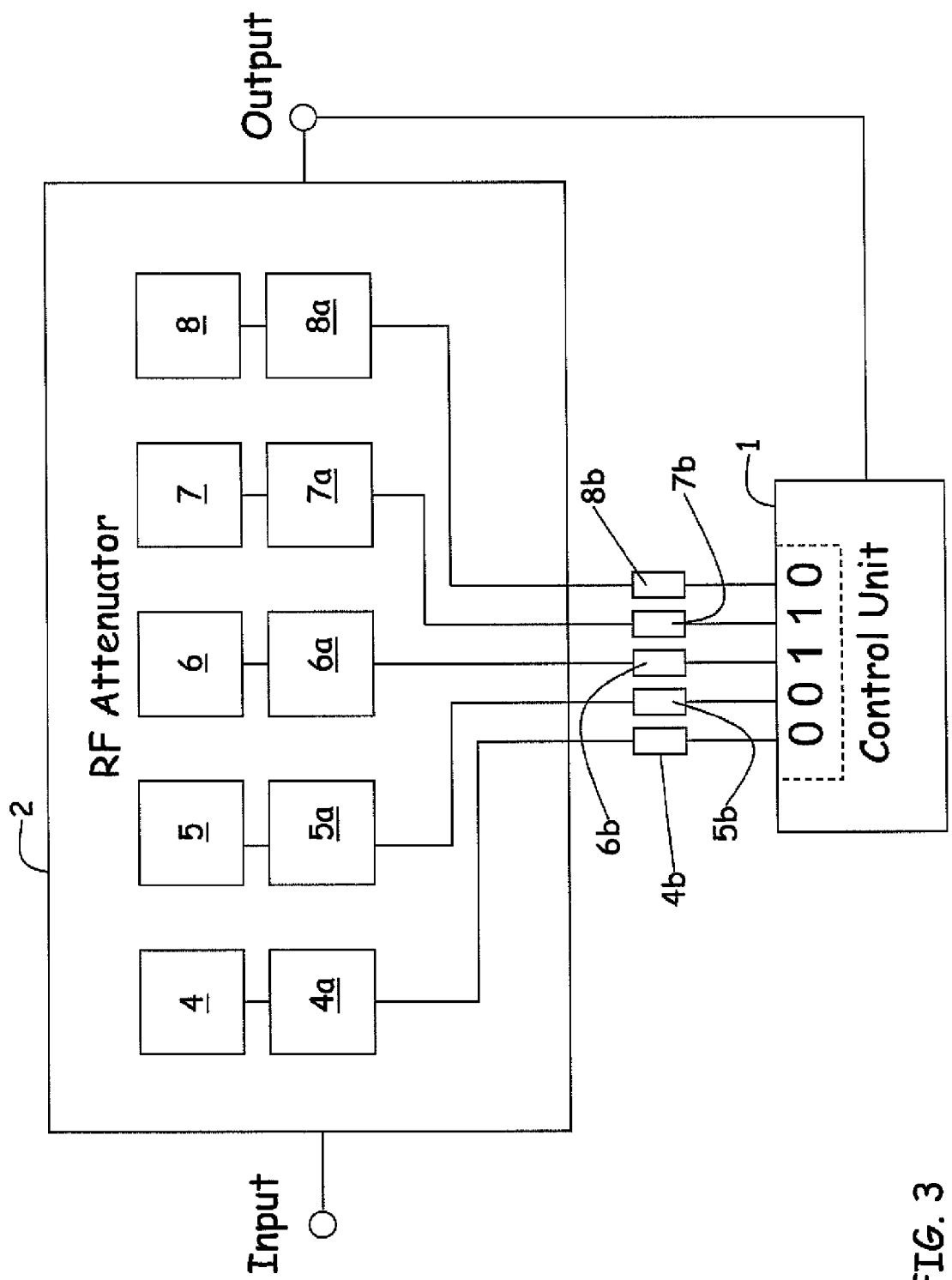
FIG. 3 is a block diagram of a system in which delay elements are coupled between a control unit and an RF attenuator, according to some embodiments.

FIG. 3 shows another embodiment, in which delay elements 4b-8b are connected between each of the control outputs of control unit 1 and a corresponding one of switches 4a-5a of RF attenuator 2. Delay elements 4b-8b may be analog delay elements selected such that they have different delays from one another, and having component values selected to be different from one another. Connecting delay elements having different delays can cause the control bits of control signal 3 to become progressively delayed with respect to one another, such that the control bits arrive at the switches 4-8 at staggered times. In some embodiments, the different delays of components 4b to 8b may prevent the switches 4a-8a from all switching at the same time, even if control unit 1 changes multiple bits simultaneously.

Figure 4:
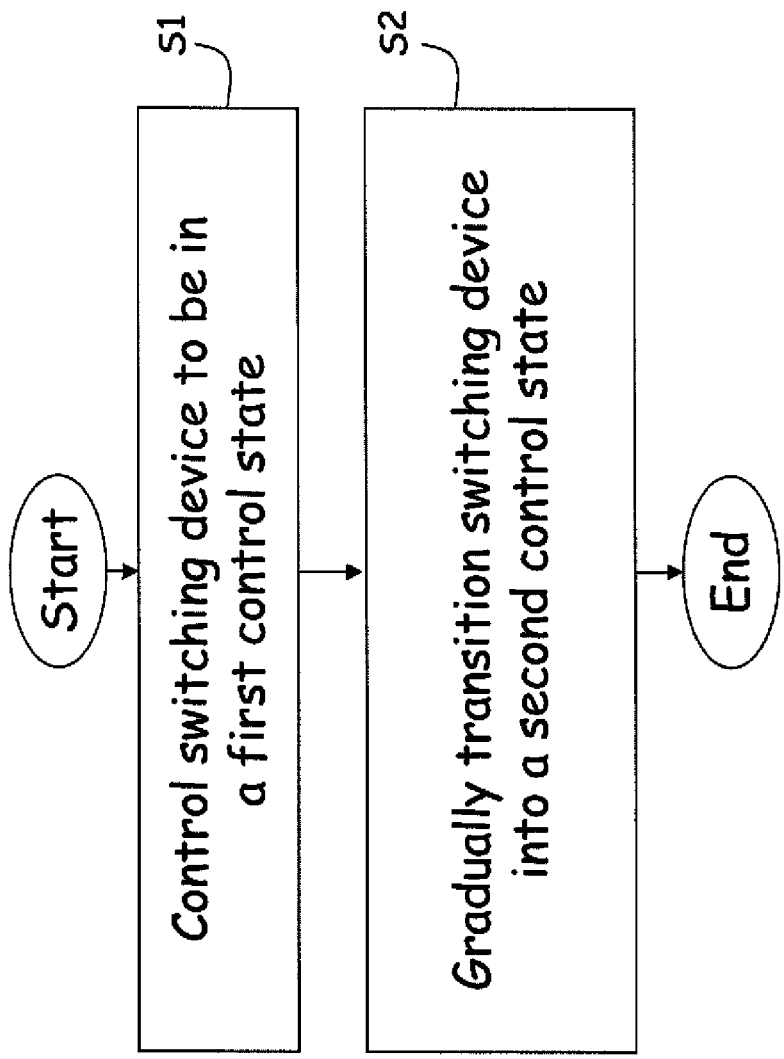
FIG. 4 is a flowchart of a method of controlling an integrated switching device, according to some embodiments.

FIG. 4 shows a method of controlling an integrated switching device, according to some embodiments. In step S1, an integrated switching device is controlled to be in a first control state. For example, if the integrated switching device is an RF attenuator, the RF attenuator may be controlled to be in a first digital control state (e.g., 00110). However, the invention is not limited to the control of RF attenuators, because the techniques described herein can be used to control other integrated switching devices. Such devices may include integrated switching devices that receive digital control signals, where each control bit controls a different integrated switch that turns on/off a respective component. Any suitable number of control bits may be used, which may depend on how many switches in the integrated switching device are controlled by the control signal.

Figure 5:
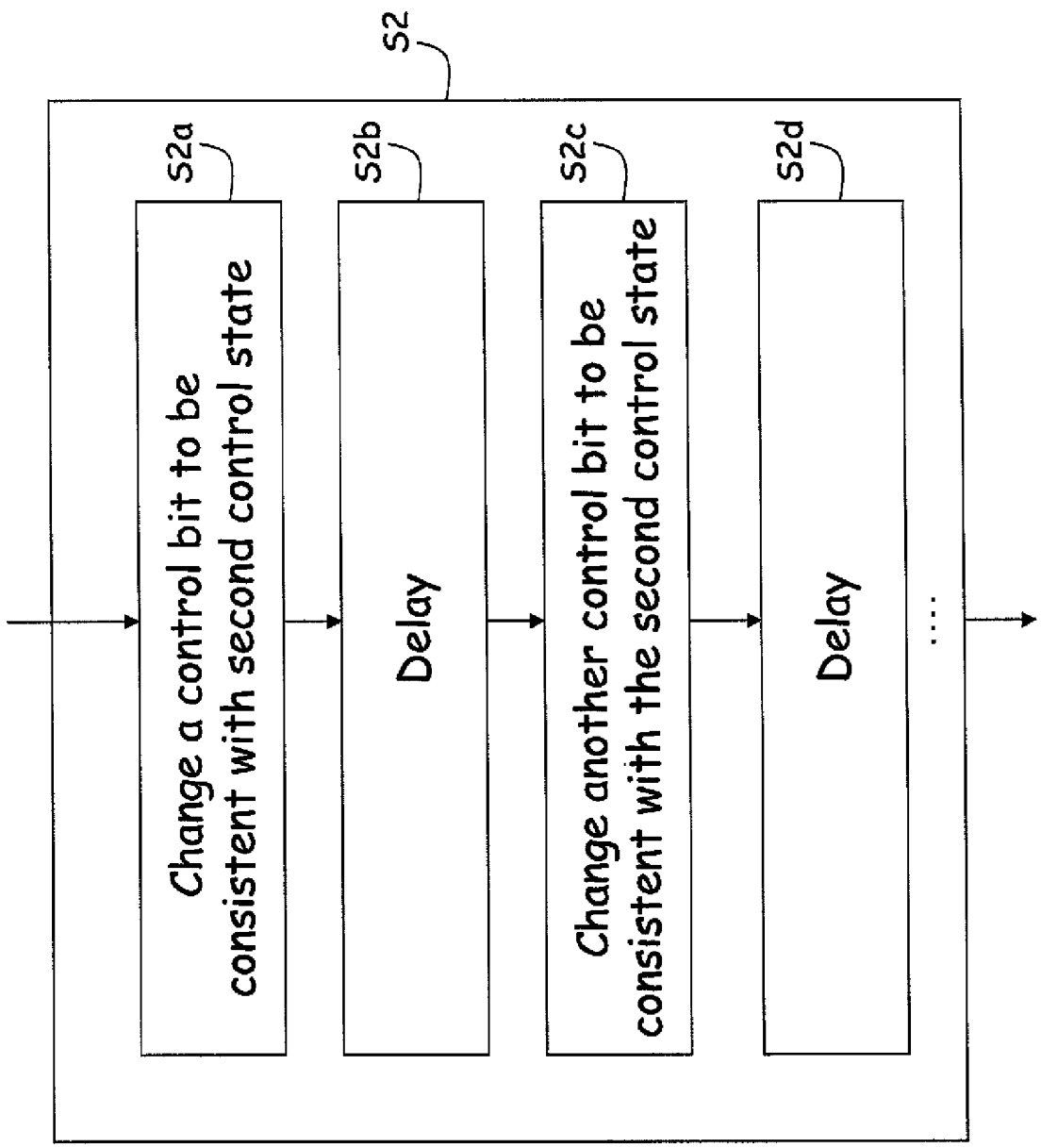
FIG. 5 is a flowchart showing an exemplary technique for implementing the method of FIG. 4, according to some embodiments.

In step, S2, the integrated switching device is gradually transitioned into the second control state (e.g., 11000). The gradual transition may be performed using any of the techniques discussed above, or any other suitable technique in accordance with the techniques describes herein. FIG. 5 illustrates one example of a gradual transition that may be performed for step S2. In step S2a, a first control bit is changed, followed by a delay S2b. Then a second control bit is changed in step S2c, followed by another delay S2d. The changing of the control bits may continue in this manner until all of the control bits have been set into the desired state. In some embodiments, the number of "steps" used to gradually transition the control bits may be equal to the number of control bits that need to be change, such as in the in the case where one control bit is changed at a time. However, a different number of steps may be used. In some embodiments, at least two steps of changing control bits may be used before reaching the desired control state, such that at least one intermediate state of the integrated switching device occurs between the initial and final control states. The control bits may be changed in any suitable number of steps, such as two steps, three steps, four steps, etc. The number of steps in which the control bits are changed can be selected based on the design of the integrated switching device so that latch-up problems are avoided, while providing an efficient transition between states. In some embodiments, the minimum interval between changing control bits may be the amount of time that it takes for transient currents within the integrated circuit to subside, such that the transient currents from different switches do not add together to create a larger transient current.

If the gradual change in control bits is performed using software, the software may be encoded on a computer storage medium having instructions, which, when executed, perform one or more steps. Such instructions may be stored in any suitable computer storage medium and executed by any suitable processor, as the techniques described herein are not limited in these respects.

The integrated switching device may be formed in any suitable integrated circuit manufacturing process, such as CMOS, for example. However, other suitable manufacturing technologies may be used. If the integrated switching device is implemented in CMOS, the switches 4a-8a may be complimentary CMOS switches, each having an NMOS transistor and a PMOS transistor in some embodiments. Furthermore, the techniques described herein can be used with integrated switching devices other than RF attenuators, including other devices having a plurality of integrated switches that control the routing or processing of a received signal.

Any suitable control connection may be used between a control device and the integrated switching device, including a parallel connection or a serial connection.

Figure 6:
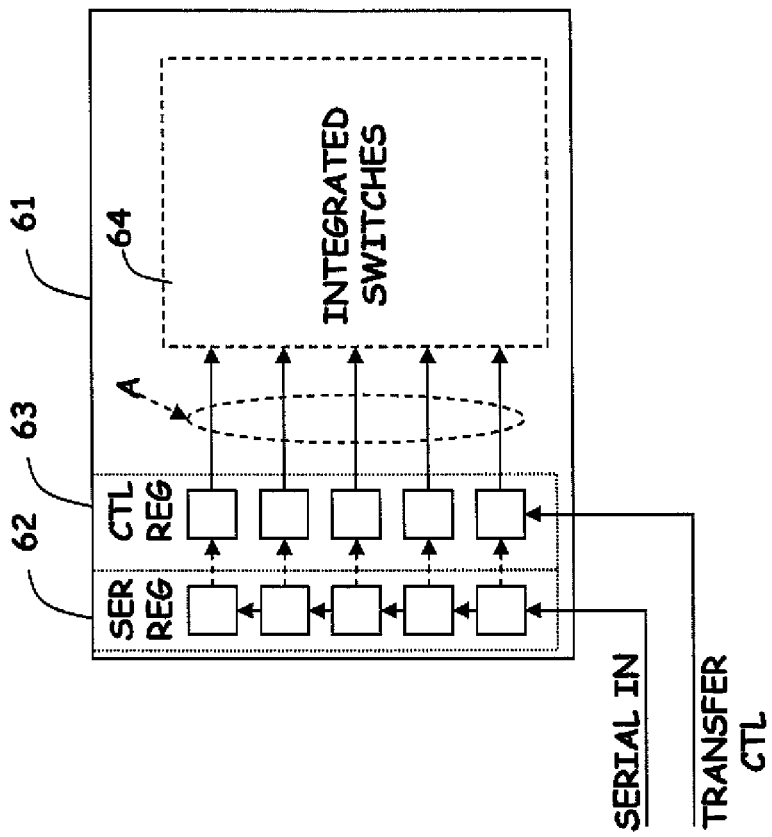
FIG. 6 shows an embodiment using a serial control technique.

FIG. 6 shows a serial control embodiment in which integrated switching device 61 is controlled by control bits provided serially from a control device (not shown) through the connection designated "Serial In." Integrated switching device 61 has a serial register 62 that stores the control bits received from the serial connection. In response to a transfer control signal "Transfer Ctl," the control bits can be transferred from serial register 62 into control register 63. The control bits may all be clocked into the control register 63 at the same time to realize the next control state, once all of the control bits for the next control state have arrived in the serial register. Through connection "A," the integrated switches 64 are driven with the control bits.

Figure 7:
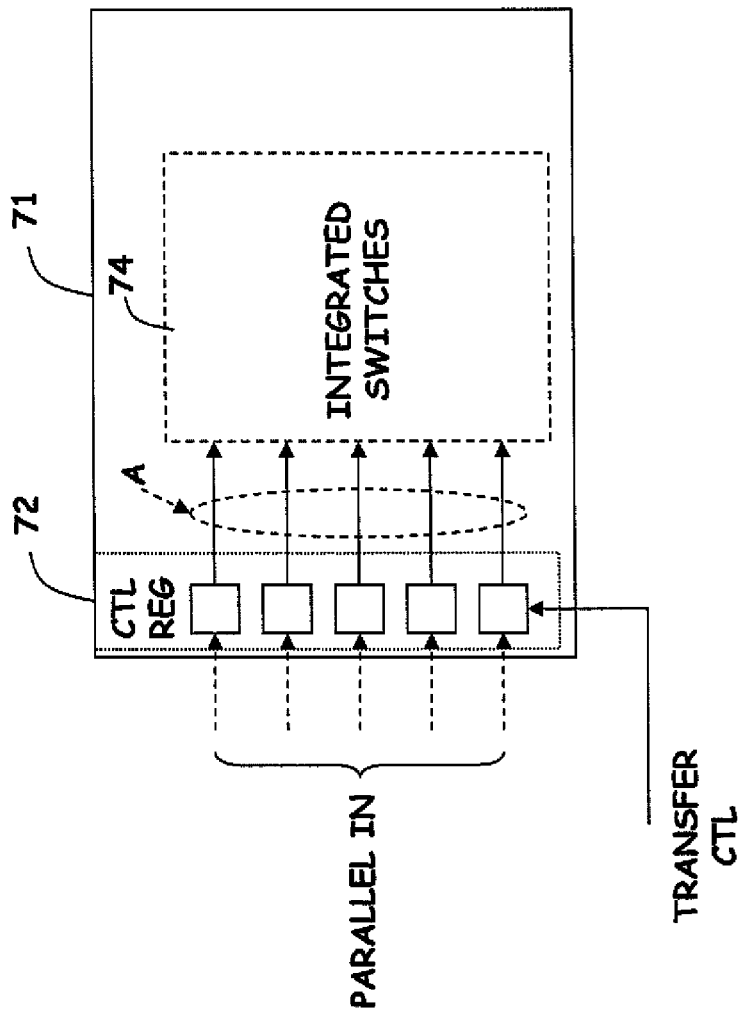
FIG. 7 shows an embodiment using an embodiment using a parallel control technique.

FIG. 7 shows a parallel control embodiment in which integrated switching device 71 is controlled by control bits provided in parallel from a control device (not shown) through the connection "Parallel In." Integrated switching device 71 has a control register 72 that stores the received control bits. Through connection "A," the integrated switches 74 are driven with the control bits.

The techniques described herein can be used regardless of whether the control bits are sent in parallel or serial, because the invention is not limited in this respect. Regardless of the type of control used, the control state of the integrated switching device may be gradually transitioned into a desired control state by driving the integrated switches (through connection "A") with control bits for one or more intermediate states, prior to driving the integrated switches with the control bits for the desired state. The control bits for the desired state may thereby arrive at the integrated switches through connection "A" at staggered times.

Having now described some illustrative embodiments of the invention, it should be apparent to those skilled in the art that the foregoing is merely illustrative and not limiting, having been presented by way of example only. Numerous modifications and other illustrative embodiments may be contemplated by those of ordinary skill in the art and are believed to fall within the scope of the invention. In particular, many of the examples presented herein involve specific combinations of method acts or system elements, it should be understood that those acts and those elements may be combined in other ways to accomplish the same objectives. Acts, elements and features discussed only in connection with one embodiment are not intended to be excluded from a similar role in other embodiments.

Use of ordinal terms such as "first," "second," "third," etc. in the claims to modify a claim element or item in the specification does not by itself connote any priority, presence or order of one element over another or the temporal order in which acts of a method are performed. Rather, these ordinal terms are used merely as labels to distinguish one element having a certain name from another element having a same name, but for the use of the ordinal term, to distinguish the elements.

What is claimed is:

1. A method of controlling an integrated circuit to transition from a first control state to a second control state, the integrated circuit comprising a plurality of switches that control processing of a received signal, the integrated circuit being controlled to be in the first and second control states in response to receiving a control signal comprising a plurality of control bits, wherein each of the plurality of control bits controls a switch state for a corresponding switch of the plurality of switches, the first control state being represented by a first plurality of control bits and the second control state being represented by a second plurality of control bits at least partially different from the first plurality of control bits, the method comprising:
    controlling the integrated circuit to be in the first state by driving the plurality of switches with the first plurality of control bits; and
    controlling the integrated circuit to be in the second state by driving the plurality of switches with the second plurality of control bits at different times, such that at least a first one of the second plurality of control bits is controlled to arrive at a first one or more of the plurality of switches at a different time than that of at least a second one of the second plurality of control bits,
    wherein the time at which the at least a second one of the second plurality of control bits arrives at a second one or more of the plurality of switches is controlled to be different enough from the time at which the at least a first one of the second plurality of control bits arrives at a first one or more of the plurality of switches so as to avoid a latch-up problem when the integrated circuit changes states.

2. The method of claim 1, wherein the arrival of the second plurality of control bits at the plurality of switches is staggered in time such that each of the second plurality of control bits arrives at a different time.

3. The method of claim 2, wherein the arrival of the second plurality of control bits is staggered in time using a plurality of delay elements that are selected to have different delays from one another.

4. The method of claim 2, wherein only one of the plurality of switches is switched at a time.

5. The method of claim 1, wherein the integrated circuit comprises an RF attenuator controlled by the control signal to perform different levels of attenuation.

6. At least one computer storage medium having stored thereon computer-executable instructions, which, when executed, perform a method of controlling an RF attenuator to transition from a first control state to a second control state, the RF attenuator comprising a plurality of switches that control processing of a received signal, the RF attenuator being controlled to be in the first and second control states in response to receiving a control signal comprising a plurality of control bits, wherein each of the plurality of control bits controls a switch state for a corresponding switch of the plurality of switches, the first control state being represented by a first plurality of control bits and the second control state being represented by a second plurality of control bits at least partially different from the first plurality of control bits, the method comprising:
    controlling the RF attenuator to be in the first state by driving the plurality of switches with the first plurality of control bits; and
    controlling the RF attenuator to be in the second state by driving the plurality of switches with the second plurality of control bits at different times, such that at least a first one of the second plurality of control bits is controlled to arrive at one or more of the plurality of switches at a different time than that of at least a second one of the second plurality of control bits,
    wherein each of the plurality of switches controls activation of a respective attenuation element of the RF attenuator.

7. The at least one computer storage medium of claim 6, wherein the time at which the at least a second one of the second plurality of control bits arrives is controlled to be different enough from the time at which the at least a first one of the second plurality of control bits arrives such that latch-up problems of switches in an integrated circuit of the RF attenuator are avoided.

8. The at least one computer storage medium of claim 6, wherein the arrival of the second plurality of control bits at the plurality of switches is staggered in time such that each of the second plurality of control bits arrives at a different time.

9. The at least one computer storage medium of claim 8, wherein only a single control bit is changed at a time.

10. A circuit for controlling an integrated circuit to transition from a first control state to a second control state, the integrated circuit comprising a plurality of switches that control processing of a received signal, the integrated circuit being controlled to be in the first and second control states in response to receiving a control signal comprising a plurality of control bits, wherein each of the plurality of control bits controls a switch state for a corresponding switch of the plurality of switches, the first control state being represented by a first plurality of control bits and the second control state being represented by a second plurality of control bits at least partially different from the first plurality of control bits, the circuit comprising:
    a control unit to generate the control signal, the control signal comprising the second plurality of control bits; and
    at least one control terminal coupled to the control unit to provide the second plurality of control bits to the plurality of switches at different times, wherein at least a first one of the second plurality of control bits arrives at one or more of the plurality of switches at a different time than that of at least a second one of the second plurality of control bits, wherein the integrated circuit comprises an RF attenuator comprising a plurality of attenuation elements, wherein each control bit of the control signal controls activation of one of the attenuation elements.

11. The circuit of claim 10, wherein the circuit further comprises:
a first delay element coupled to a first control terminal of the at least one control terminal, the first delay element providing a first delay; and
a second delay element coupled to a second control terminal of the at least one control terminal, the second delay element providing a second delay selected to be different from the first delay.

12. The circuit of claim 10, wherein the control unit is programmed to stagger the timing at which the second plurality of control bits are provided to the at least one control terminal.

13. The circuit of claim 12, wherein the control unit changes no more than one control bit at a time.

14. The circuit of claim 13, wherein the control unit changes no more than one control bit per clock cycle.

15. The circuit of claim 13, wherein the time at which the at least a second one of the second plurality of control bits is provided is controlled to be different enough from the time at which the at least a first one of the second plurality of control bits is provided such that latch-up problems of switches in the integrated circuit are avoided.

16. The circuit of claim 10, wherein each of the plurality of switches controls the activation of a different element of the integrated switching component.

* * * * *